United States Patent [19]

Deal et al.

[11] Patent Number: 4,686,691
[45] Date of Patent: Aug. 11, 1987

[54] MULTI-PURPOSE REGISTER FOR DATA AND CONTROL PATHS HAVING DIFFERENT PATH WIDTHS

[75] Inventors: Gregory K. Deal, West Chester, Pa.; Richard J. Manco, Riverside, N.J.

[73] Assignee: Burroughs Corporation, Detroit, Mich.

[21] Appl. No.: 678,027

[22] Filed: Dec. 4, 1984

[51] Int. Cl.[4] ............................................. G11C 19/00
[52] U.S. Cl. ....................................... 377/54; 377/55; 377/70; 365/219
[58] Field of Search ............... 377/70, 55, 54; 365/83, 365/219, 220

[56] References Cited

U.S. PATENT DOCUMENTS

| | | | |
|---|---|---|---|
| 3,605,024 | 9/1971 | Batcher | 377/70 |
| 4,176,400 | 11/1979 | Heckel | 377/54 |
| 4,395,764 | 7/1983 | Matsue | 377/54 |
| 4,396,829 | 8/1983 | Sugihara et al. | 377/73 |

OTHER PUBLICATIONS

"Very Long Shift Registers Can be Built with Rams", by Warner, Jr., p. 128, Electronic Design, Jan. 4, 1977.

Primary Examiner—John S. Heyman
Attorney, Agent, or Firm—Mervyn L. Young; Kevin R. Peterson; L. J. Marhoefer

[57] ABSTRACT

A multi-purpose register formed of various cells of a customized integrated circuit gate array chip having input gate cells, multiplexor cells, flip-flop cells and output gate cells. The flip-flop cells may be segmented into registers of different widths or may be employed as individual flip-flop cells depending upon the mode in which the register array is to be employed.

6 Claims, 9 Drawing Figures

MULTI-PURPOSE REGISTER FOR DATA AND CONTROL PATHS HAVING DIFFERENT PATH WIDTHS

BACKGROUND OF THE INVENTION

1. Field of Invention

This invention relates to a multi-purpose register, and more particularly, to one which can be used with data and control paths having different widths.

2. Description of the Prior Art

MOS field effect transistor gates have a relatively simple structure which require fewer masking steps in their fabrication than are required for bipolar transistor gates. This, in turn, allows for tighter design tolerances such that MOS circuits can be fabricated with high-packing densities in the creation of large memory arrays and microprocessors to be placed upon a single integrated circuit chip. However, bipolar transistor gates have higher switching speeds which are desirable in building larger main frame processors that can process much larger volumes of data than can microprocessors of the type referred to above.

In the past, many large main frame processors employing bipolar logic integrated circuits required many thousands of such integrated circuit chips and each chip or group of chips had to be separately designed to create the appropriate registers and other logic that went to form the processor. In each case, different sets of masks had to be created for each type of chip with a resulting delay in design time as well as fabrication time. Also, the costs involved often forced the designer to go to standard "off-the-shelf" type of integrated circuit chips so that the processor design had to be compromised as to its performance. This large number of bipolar integrated circuit chips resulted from the fact that the bipolar transistor structure is more complex than that of a MOS field effect transistor with a resultant increase in the number of masking steps required in its fabrication and a loosening of design tolerances so that packing densities cannot be achieved with bipolar logic that could be achieved with MOS logic.

In the past few years, various bipolar integrated circuit houses have begun supplying a set of logic chips which are referred to as "gate array" logic wherein different sets of chips are provided with a family of logic gates such as flip-flops, multiplexors, input gates and output gates. Before the chips are diced from their wafer, they are interconnected by a metallization process in accordance with the circuit design specified by the computer circuit designer to form a customized integrated circuit chip. In this manner, the integrated circuit house can achieve volume production of wafers at lower costs and the circuit designer specifies the integrated circuit chip having a particular set of logic gates on it and how they are to be interconnected to achieve the circuit and function desired. The circuit designer can now design the particular set of registers and other logic circuits that he wants without incurring the higher cost of not buying "off-the-shelf" circuits.

A particular component that is widely used throughout a processor is the register. Furthermore, such registers are used not only in the data paths of the processor but also in the information control paths for both instructions and other information such as literal values, etc. Thus, there is not one standard register that can be used throughout the processor. It is therefore advantageous to be able to obtain a bipolar register chip that can be used for all or many of the various purposes for which registers are employed without having to design separate registers for the semiconductor manufacturer, who, in turn, has to make separate sets of masks and go through the various processing steps of fabrication for each register. With the advent of gate array integrated circuits, it is now possible to design such a register.

It is then an object of the present invention to provide a multi-purpose register that can be used for various data and control paths which nevertheless have different path widths.

It is another object of the present invention to provide a multi-purpose register which can operate in different modes according to control signals provided so as to set the register's width to achieve different numbers of bits.

It is still a further object of the present invention to provide such an improved multi-purpose register that can be set to any number of bits wide from one bit up to the total number of flip-flops in the register.

SUMMARY OF THE INVENTION

In order to accomplish the above-identified objects, the present invention is directed toward a customized integrated circuit gate array chip or die which employs standard input gate cells, multiplexor cells, flip-flop cells and output gate cells. The flip-flop cells are arranged to form a register which may be partitioned into a number of different segments. Multiplexor cells are used both for interconnecting the flip-flop cells together for shifting data therethrough and into one pair of flip-flop cells which serve as mode control for the register and into a vector of flip-flops which serve as inversion control on various groups of output data. The multiplexor cells are also employed to receive data and control signals from different input cells and to direct them either to load, reset and other gates or to the respective flip-flop cells depending upon the mode in which this multi-purpose register has been set. The manner in which the array of flip-flop cells may be divided includes using individual cells (along with inverters) so that the flip-flop cells may provide either a positive or inverted output signal. In this manner, a general purpose register is provided which may be of any width from one bit up to the total number of flip-flops employed to form the register.

A feature then of the present invention resides in a multi-purpose register formed by the interconnections of a gate array integrated circuit chip or die which register may be placed in a number of different modes to create a register width of any number of bits from one up to the maximum number of flip-flop cells used to form the register.

BRIEF DESCRIPTION OF THE DRAWINGS

The above-identified objects, advantages and features will become more readily apparent from a review of the following specification taken in conjunction with the drawings wherein.

GENERAL DESCRIPTION OF THE INVENTION

The general purpose register array of the present invention can be employed with a number of different data and control paths within a processor even though those different paths have different path widths. The register array's function can range from individually controlled flip-flops with two load inputs, data input, reset input and true or inverted outputs for each flip-flop to a single register whose width is equal to the number of flip-flops available in the array for register use. Some of the flip-flops within the array are employed for mode control, to specify the different modes in which the register array is designed to operate, while others are used for inversion control.

The register array of the present invention is implemented on a single integrated circuit chip or die which is provided with a limited number of pin contacts for control and data inputs and outputs. In the chip of the present invention there are 68 such input and output pin contacts; where 56 of them are employed for data and control signals and the remainder are power and ground contacts. When the array is placed in a mode that allows a number of individual flip-flop cells to operate separately, then more control signals are required since the flip-flop cells are individually controlled and thus there are a lesser number of input and output pin contacts available for data reception and transmission. Conversely, when the array is placed in a single register mode using all of the flip-flop cells available for that register then only one set of control signals is required thereby freeing the remaining input and output pins for use in receiving input data signals and outputting such data signals.

Since the respective input and output pin contacts are employed for different purposes depending upon the mode in which the register array has been placed, a plurality of multiplexor cells are provided between the input pins and the flip-flop cells to switch the respective input signals either to the respective flip-flop cells or to control logic which controls the operation of the flip-flop cells. In addition, these multiplexor cells under control of a dedicated pin serve to interconnect all flip-flop cells as a single shift by which maintenance is performed. Through the maintenance process, the contents of the mode and invert flip-flop cells are setup to specify the particular mode in which the register array is to operate.

The basic operation of each flip-flop is as follows. When a clock pulse is received, and the reset signal is high, then the flip-flop is set to 0. Otherwise, if both the load signal and the enable signal are high, then the data input is loaded into the flip-flop cell. If either the load or enable signals are low, then the flip-flop cell does not change state.

Figure 1:
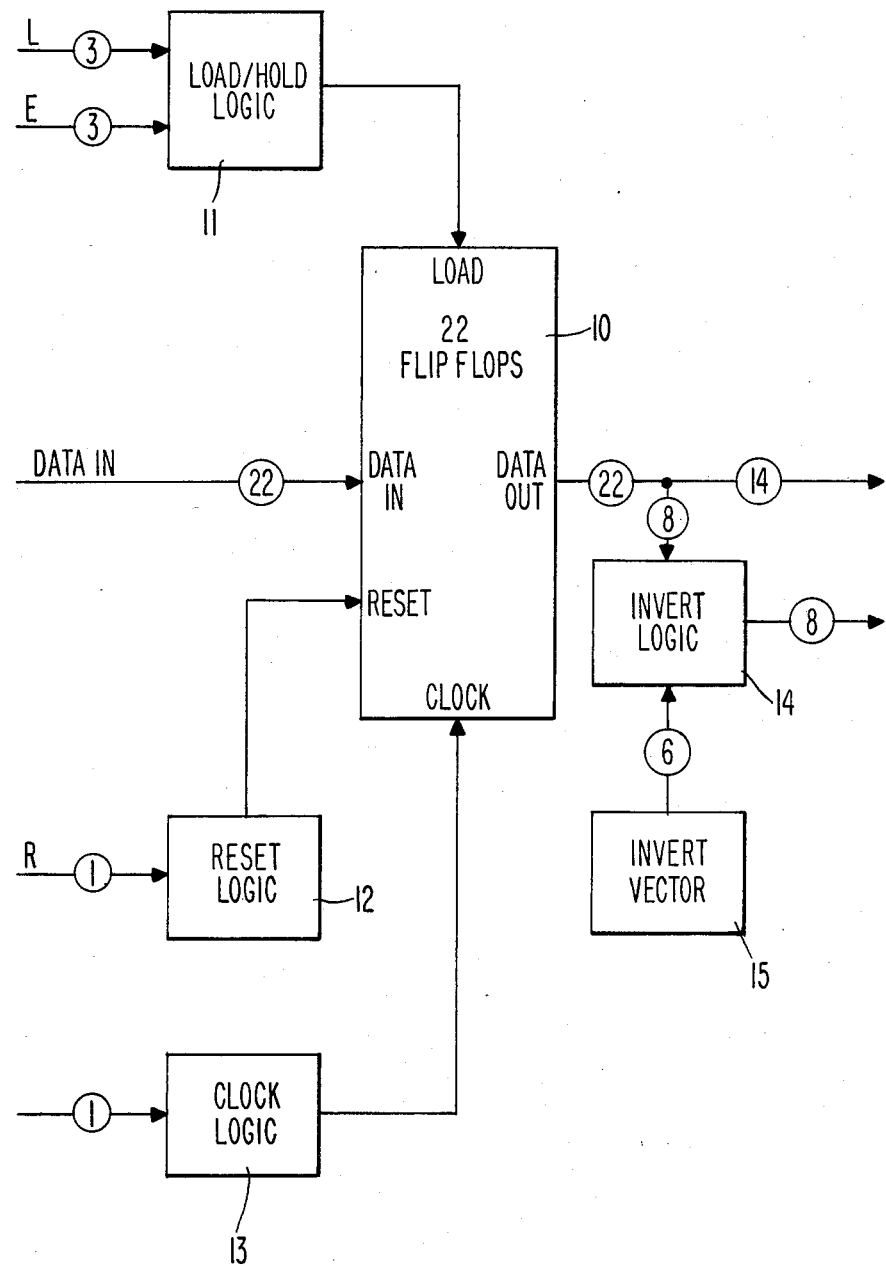
FIG. 1 is an overall view of the multi-purpose register of the present invention.

A general overview of the register array of the present invention when set in a single register mode is illustrated in FIG. 1. With the pin count as given above, register 10 is 22 bits wide and requires but one set of load, enable and reset signals for operation. The reason that three load signals and three enable signals are illustrated as being supplied to load/hold logic 11 will be more thoroughly described below when other modes are described with the flip-flops being segmented into different sized registers. As illustrated in FIG. 1, portions of the output of register 10 can either be a true output, or inverted, or a variation thereof as will be more fully described below.

DETAILED DESCRIPTION OF THE INVENTION

Figure 2:
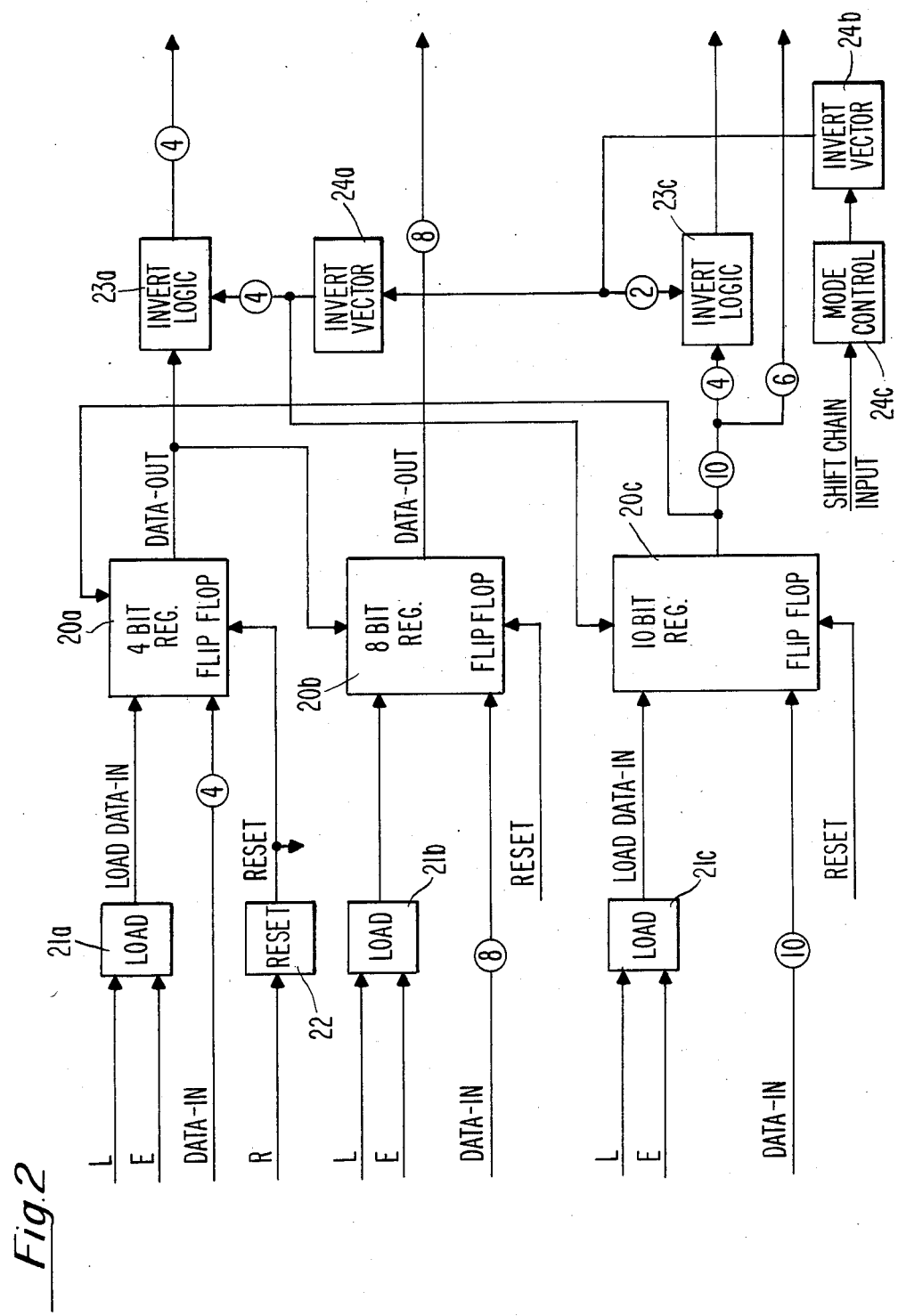
FIGS. 2, 3 and 4 are schematics of how the multi-purpose register may be segmented for various modes of operation with different data path widths.

FIG. 2 is a schematic illustrating one mode of operation of the register array of the present invention. In this mode, various register flip-flop cells are segmented into three registers: four-bit register 20a, eight-bit register 20b and ten-bit register 20c. Also in this mode, portions of the output of registers 20a and 20c may be inverted by corresponding invert logic and invert vectors as illustrated in FIG. 2 and will be more thoroughly described below.

Each set of flip-flops forming respective registers require one load signal and enable signal which are supplied to each of the load/hold logics 21a, 21b and 21c. This is the reason that FIG. 1 showed three load and three enable signals. However, only one reset signal is required for the three registers of FIG. 2 with the reset logic 22 supplying that signal to all three registers.

As was indicated above, all of the register flip-flop cells may be coupled together to form a shift register and this is illustrated diagrammatically in FIG. 2. In this maintenance mode, either 1's or 0's are shifted in to all flip-flops. In this way the mode flip-flops (24c) and invert flip-flop (24 a,b) are initialized. The user accessible flip-flops (20 a, b, c) may also be initialized in this manner. As was indicated above and will be discussed below, the actual interconnection of the flip-flops to obtain this shift register is provided by a series of multiplexors which are normally under control of mode control logic 24c for the purpose of placing the register array of the present invention in its different modes. In maintenance mode, a dedicated pin forces all flip-flops into the shift register configuration.

Figure 3:
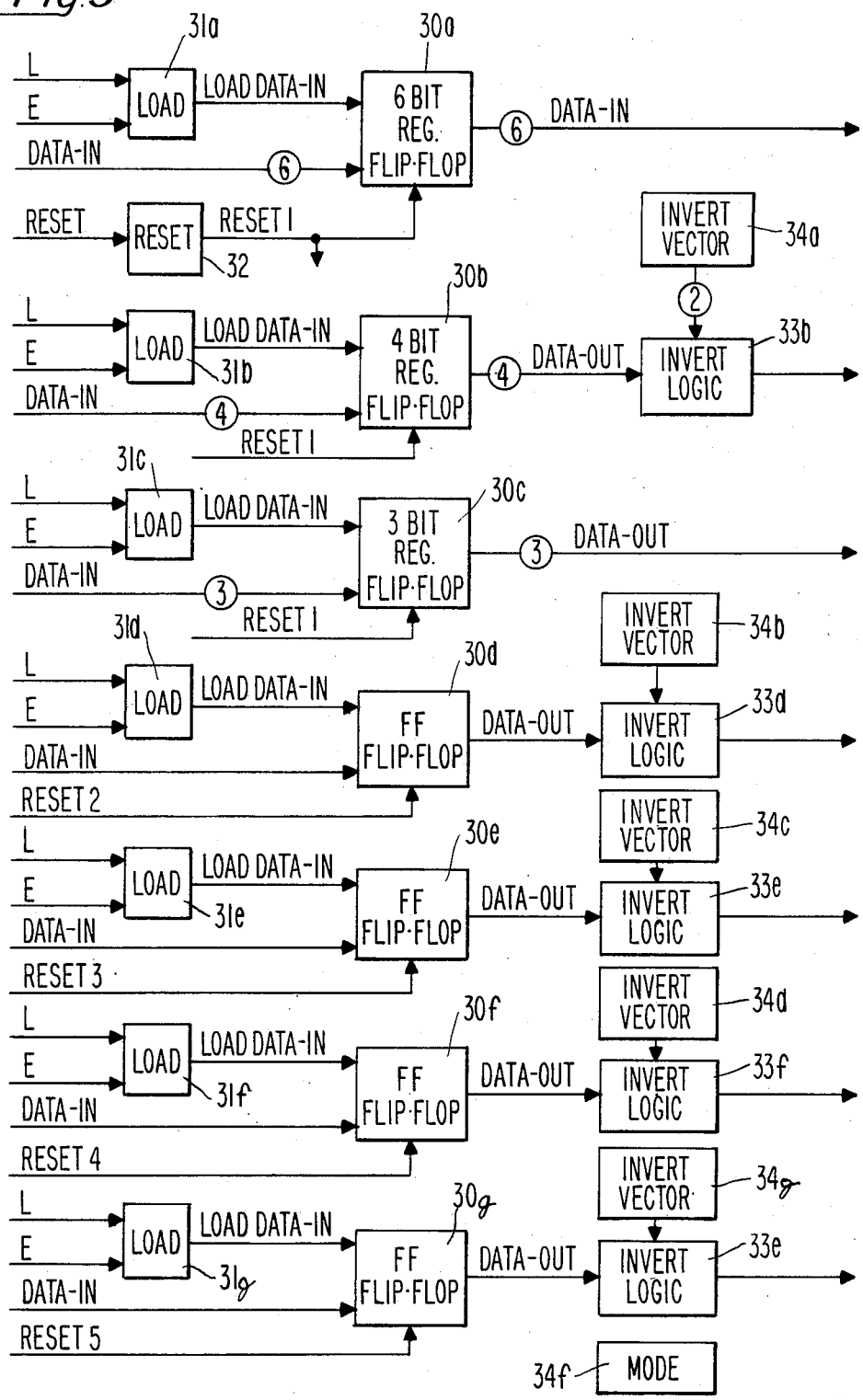

FIG. 3 illustrates the arrangements of the register flip-flop cells in a different mode, this time with a seventeen-bit wide register, eight bits of which may be inverted based upon the invert vector. In this mode, register 30a is a six-bit register, register 30b is a four-bit register, register 30c is a three-bit register and registers 30d–30g are one-bit registers. In this mode, the output of register 30b and individual flip-flop cells may be inverted by the respective invert logic illustrated in FIG. 3. Each of the respective registers are provided with their individual load/hold logic 31a–31g. One reset signal from reset logic 32 is employed to reset registers 30a–30c. Registers 30d–30g have individual reset logic.

Figure 4:
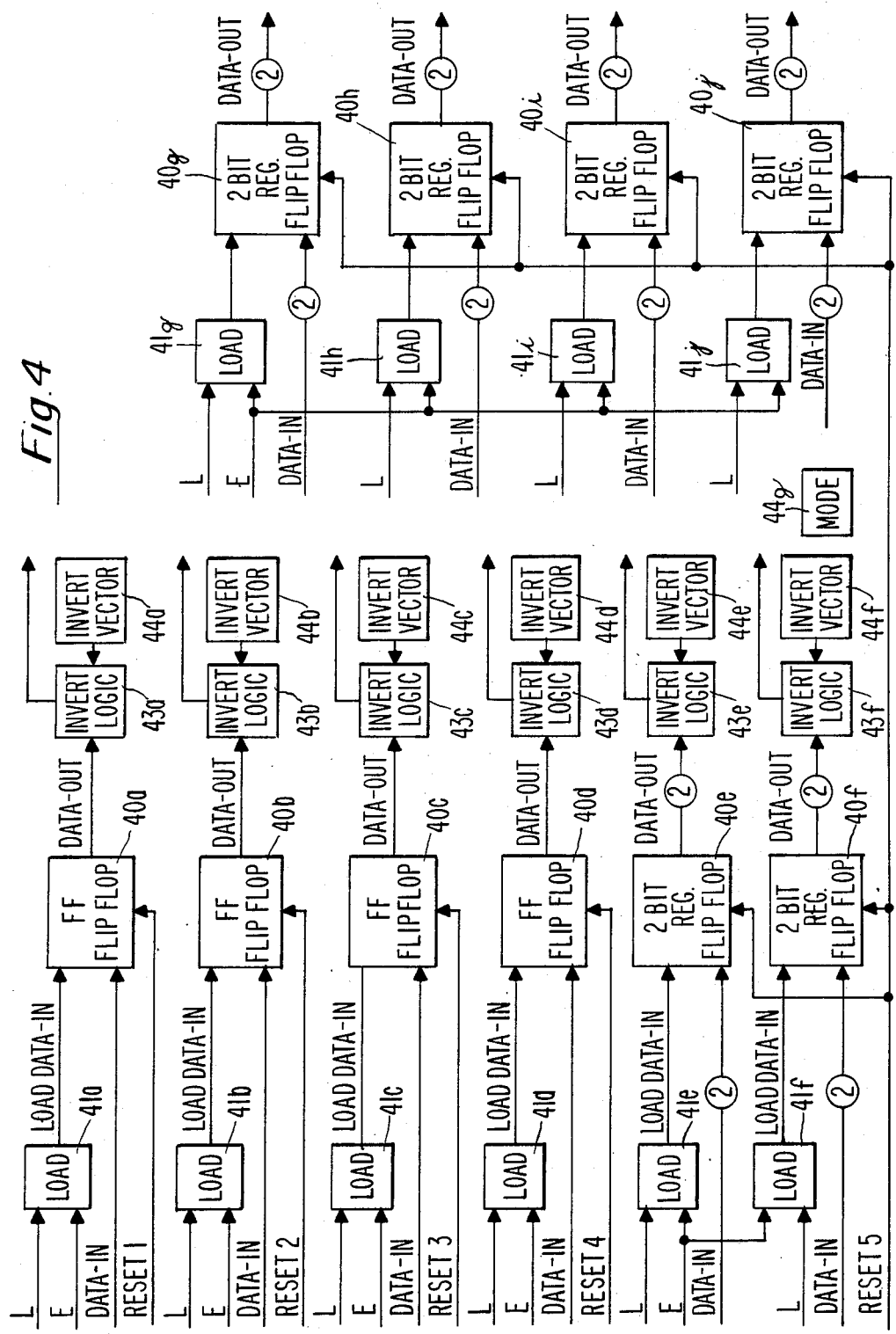

FIG. 4 is a schematic of the register array of the present invention when arranged as a sixteen-bit register, eight bits of which may be inverted based upon the invert vector. Registers 40a–40d are individual flip-flop cells while registers 40e–40j are two-bit registers. Inversion logic and invert vectors 43a–43f and 44a–f are provided for the respective registers and flip-flops for the corresponding inversion.

Figure 5:
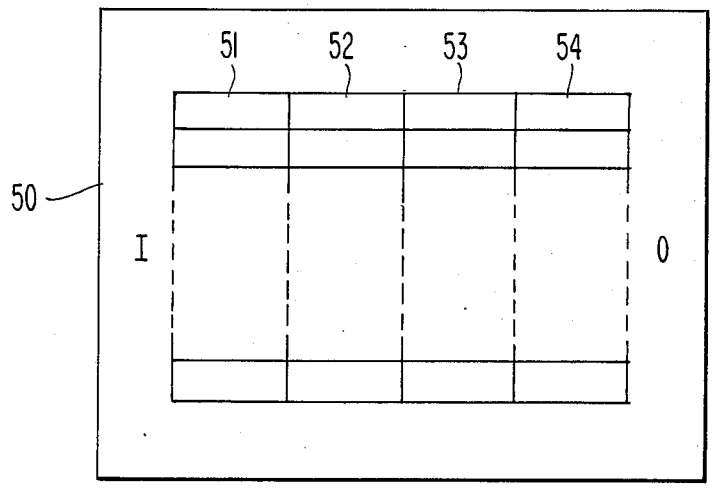
FIG. 5 is a diagram of the arrangement of different cells as they would exist on a data array integrated circuit chip or die.

FIG. 5 illustrates the layout of individual cells in gate array chip 50. For correspondence of the relation of the cells to the schematics of FIGS. 2, 3 and 4, the input cells would reside in the area of I of chip 50 and output cells would reside in the area of O of chip 50. In actuality, depending upon the mode in which the array has been placed, some pin contacts may be input pins in one mode and output pins in another mode.

Figure 6A:
FIGS. 6A–D are schematic logic diagrams of the principal types of cells as they exist on gate array integrated circuit chip or die.
Figure 6B:
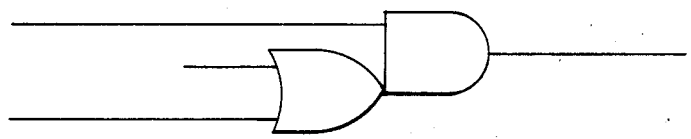
Figure 6C:
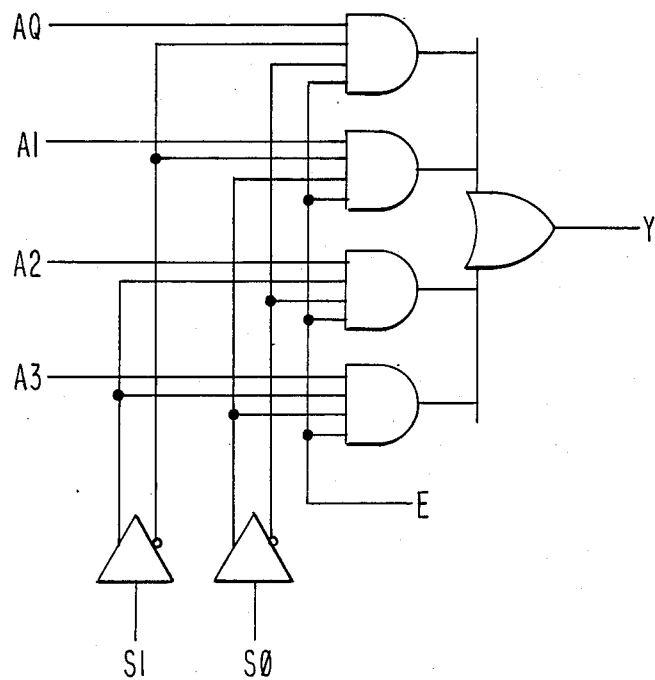
Figure 6D:
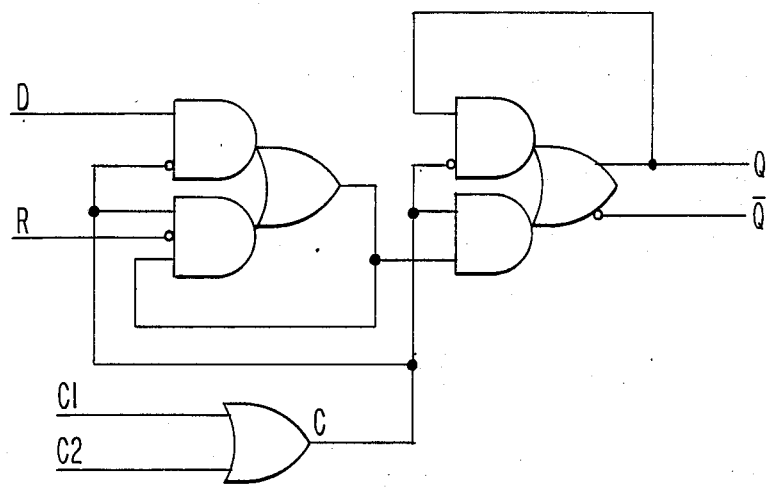

Cell columns 51 and 52 contain the respective multiplexor cells which are under control of the mode control flip-flops to select which input signals are to be transmitted to the different flip-flop cells and also to interconnect the flip-flop cells as a shift register as was described above. Cell columns 53 and 54 would contain the individual flip-flop cells. FIG. 6A represents an example of an input cell which is just an inverted OR, or NOR gate. FIG. 6B represents a typical output gate. FIG. 6C is a typical multiplexor cell and FIG. 6D is a typical flip-flop cell as employed in the gate array of the present invention.

EPILOGUE

A multi-purpose register has been described above which is formed of various cells of a customized integrated circuit gate array chip having input gate cells, multiplexor cells, flip-flop cells and output gate cells. The flip-flop cells may be segmented into registers of different widths or may be employed as individual flip-flop cells depending upon the mode in which the register array is to be employed. Inversion control logic containing additional flip-flop cells is provided to determine the polarity of various data outputs. Mode control logic containing additional flip-flop cells is provided to determine the mode in which the array is to be placed by controlling the selection of various inputs to the respective multiplexor cells. A dedicated pin overrides the mode determination, and causes all of the flip-flop cells to be connected together to form a shift register for maintenance and also to load the mode and invert control cells.

While but one embodiment of the present invention has been disclosed, it will be apparent to those skilled in the art that variations and modifications may be made therein without departing from the spirit and the scope of the invention as claimed. This might include changes in the number of pins used for each function, different numbers of bits in each register, internal flip-flops for controlling other functions beside output inversion, different functional operation of a flip-flop, combinatorial functions applied to the flip-flop outputs, and so forth.

What is claimed is:

1. A register circuit comprising:
   a plurality of flip-flop circuits;
   a plurality of output circuits, one for each flip-flop circuit;
   a plurality of input circuits;
   switching means coupled between said input circuits and said flip-flop circuits to selectively form a parallel register of n bits in width where n can vary from one to the total number of said plurality of flip-flop circuits where each flip-flop circuit represents a particular significant bit;
   mode control means coupled to said switching means to indicate the number of flip-flop circuits to be connected to form said register;
   said switching means being multiplexor circuits coupled to said respective flip-flop circuits and to said input circuits; and
   each multiplexor circuit being selectively coupled to the output circuit of the next lowest significant bit flip-flop circuit to form a shift register.

2. A register circuit according to claim 1 further including:
   mode control means coupled to said flip-flops to indicate the number of flip-flops to be connected to form said register, said mode control means being coupled to the next lowest significant bit flip-flop circuit to receive mode indicating signals.

3. An integrated circuit comprising:
   a plurality of flip-flop circuits;
   a plurality of output circuits, one for each flip-flop circuit;
   a plurality of input circuits;
   switching means coupled between said input circuits and said flip-flop circuits to selectively form a parallel register of n bits in width where n can vary from one to the total number of said plurality of flip-flop circuits where each flip-flop circuit represents a particular significant bit;
   mode control means coupled to said switching means to indicate the number of flip-flop circuits to be connected to form said register;
   said switching means being multiplexor circuits coupled to said respective flip-flop circuits and to said input circuits; and
   each multiplexor circuit being selectively coupled to the output circuit of the next lowest significant bit flip-flop circuit to form a shift register.

4. An integrated circuit according to claim 3 wherein:
   mode control means coupled to said switching means to indicate the number of flip-flop circuits to be connected to form said register.

5. An integrated circuit according to claim 3 wherein:
   said switching means are multiplexor circuits coupled to said respective flip-flop circuits and to said input circuits.

6. An integrated circuit according to claim 3 further including:
   mode control means coupled to said flip-flops to indicate the number of flip-flops to be connected to form said register, said mode control means being coupled to the next lowest significant bit flip-flop circuit to receive mode indicating signals.

* * * * *